United States Patent [19]
Ohmi

[11] Patent Number: 5,806,543
[45] Date of Patent: Sep. 15, 1998

[54] WET STATION, AND METHOD OF AND APPARATUS FOR WET CLEANING USING SAID WET STATION

[76] Inventor: Tadahiro Ohmi, 1-17-301, Komegabukuro 2-chome, Aoba-ku, Sendai-shi, Miyagi-ken 980, Japan

[21] Appl. No.: 554,549

[22] Filed: Nov. 6, 1995

[51] Int. Cl.$^6$ .................................................. B08B 15/00
[52] U.S. Cl. ............................ 134/61; 134/109; 134/111; 134/902
[58] Field of Search .................... 134/109, 111, 134/902, 155, 186, 61, 25.4, 10, 26

[56] References Cited

U.S. PATENT DOCUMENTS

| | | | |
|---|---|---|---|
| 4,520,834 | 6/1985 | DiCicco | 134/902 |
| 5,190,064 | 3/1993 | Aigo | 134/902 |
| 5,265,632 | 11/1993 | Nishi | 134/902 |
| 5,299,584 | 4/1994 | Miyazaki et al. | 134/56 R |
| 5,445,171 | 8/1995 | Ohmori et al. | 134/61 |
| 5,507,847 | 4/1996 | George . | |

FOREIGN PATENT DOCUMENTS

| | | | |
|---|---|---|---|
| 3-229416 | 10/1991 | Japan | 134/902 |
| 4-79324 | 3/1992 | Japan | 134/902 |
| 4-225230 | 8/1992 | Japan | 134/902 |
| 4-354334 | 12/1992 | Japan | 134/902 |
| 5-55191 | 3/1993 | Japan | 134/902 |

OTHER PUBLICATIONS

EPO 497,247 (EPO '247) Aug. 1992.

*Primary Examiner*—Frankie L. Stinson
*Attorney, Agent, or Firm*—Baker & Daniels

[57] ABSTRACT

A wet station, a wet cleaning method and a wet cleaning apparatus are provided, in which throughput of ultrapure rinse is high, and chemicals and ultrapure water can be regenerated and reused.

The wet station is characterized in that a filter made of polytetrafluoroethylene is installed in a ceiling of a wet bench, inside of which wet process apparatuses are provided, and that a spray shower device having a finely-porous nozzle is installed in an upper space between a chemical bath and an ultrapure water rinse bath, both being located inside said wet bench. Furthermore, the wet cleaning method is characterized in that a substrate to which chemicals are attached is cleaned by using ultrapure water or ozonized ultrapure water, and that ultrapure water after said cleaning is collected and made to flow into dedicated piping so that said ultrapure water after said cleaning can be fractionally recovered. Furthermore, the wet cleaning apparatus is characterized in that, for the purpose of fractional recovery of ultrapure water after said cleaning, a collector for collecting ultrapure water and dedicated piping are provided.

5 Claims, 5 Drawing Sheets

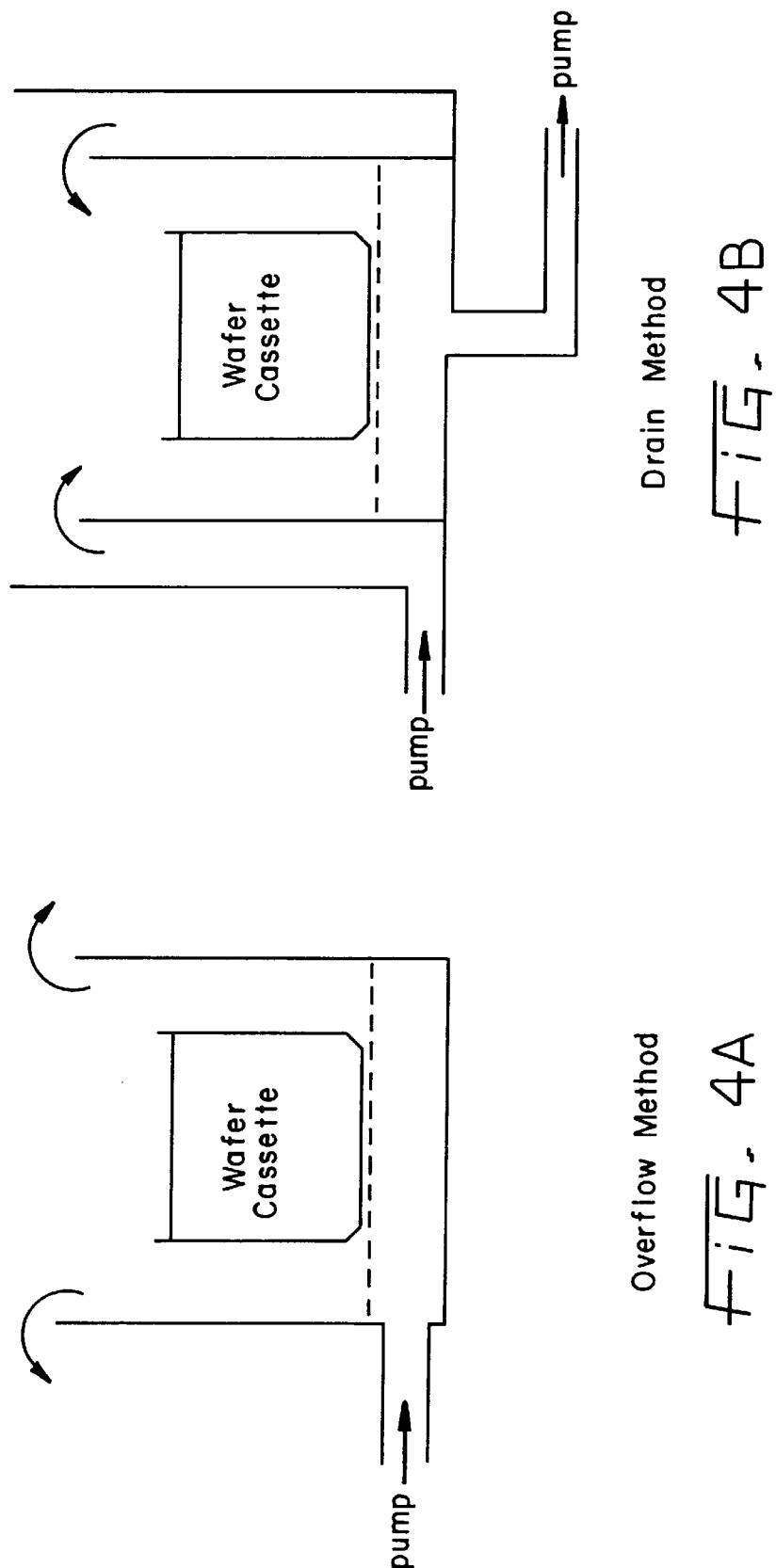

WET STATION, AND METHOD OF AND APPARATUS FOR WET CLEANING USING SAID WET STATION

BACKGROUND OF THE INVENTION

1. Field of the Invention

The present invention relates to a wet station, and a method of and an apparatus for wet cleaning using the wet station. More particularly, the present invention relates to a wet station in a wet process of semiconductor fabrication. After a substrate is treated with chemicals, and before the substrate is rinsed in an ultrapure water rinse bath, the chemicals are washed off by spraying ultrapure water from a spray shower.

2. Description of Related Art

Conventionally, in a wet process of semiconductor fabrication, there has been the problem of rinsing a substrate, such as a wafer, with ultrapure water after the substrate has been cleaned with chemicals. Specifically, the problem is that it takes a long time to rinse the substrate with ultrapure water because the chemical contaminants are introduced with the substrate into the ultrapure water bath. However, it is important to shorten the rinse time in order to raise the overall throughput of the fabrication process.

At present, the following two methods are used to rinse substrates:

The first method uses two rinse baths, one of which is used for preparatory cleaning. In the second method, cleaning is effected by repeating a combination of filling a rinse bath with water in a few minutes and then draining the bath in a few seconds.

In the above two methods, however, the shortcoming is that a long time is required for replacing the rinse fluid in the preparatory bath in the first method, and for carrying out the operation in the second method.

Further, it is impossible to remove organic substances attached to the wafer surface by rinsing with ordinary ultrapure water only. Accordingly, organic substances attached to the surface of the wafer have been removed by hydrochloric acid-hydrogen peroxide solution cleaning or ammonium-hydrogen peroxide solution cleaning.

Further, using a glass fiber filter in a clean bench has caused high pressure losses. Additionally, there has been problematic contamination of boron etc., caused by evaporation of hydrofluoric acid-type chemicals.

SUMMARY OF THE INVENTION

An object of the present invention is to provide a wet station which attains high throughput of an ultrapure water rinse process, which process removes organic substances attached to a wafer.

Another object of the present invention is to provide a wet cleaning method which allows regeneration of chemicals.

A further object of the present invention is to provide a wet cleaning apparatus which allows regeneration of chemicals.

A wet station according to the present invention is characterized in that a filter made of polytetrafluoroethylene exhibiting low pressure loss and high collection rate properties is provided in a ceiling of a wet bench where other wet process apparatuses are installed. In the upper space between a chemical bath and an ultrapure water rinse bath, which are both located inside the wet bench, a spray shower device having a finely-porous nozzle is provided.

A wet cleaning method using the wet station according to the present invention is characterized in that a substrate to which chemicals are attached is cleaned by means of ultrapure water or ozonized ultrapure water. After the cleaning, the used ultrapure water is collected and drained to dedicated piping, allowing fractional recovery of the ultrapure waste water.

Further, a wet cleaning apparatus using the wet station according to the present invention is characterized in that, for the purpose of separate recovery of the used ultrapure water, a collector is provided. The collector is used in combination with the dedicated piping.

In the preferred embodiment a filter made of polytetrafluoroethylene exhibiting low pressure loss and high collection rate properties is provided in the ceiling of a wet bench, allowing decreased running cost and decreased particulate contamination. Further, in the upper space between a chemical bath and an ultrapure water rinse bath, which are both located inside the wet bench, a spray shower having a finely-porous nozzle is provided. Employing the spray shower shortens ultrapure water rinse time and decreases the amount of ultrapure water used.

In another embodiment of the invention, ozonized ultrapure water is supplied to the ultrapure water rinse bath and to the spray shower device so that organic substances, metal, particles and the like disposed on the substrate are cleaned with increased effectiveness. Further, a thin oxide film, which serves as a protective film, is generated on the substrate.

The substrate to which chemicals are attached is cleaned by ultrapure water or ozonized ultrapure water, and the used ultrapure water is collected and drained by dedicated piping, allowing fractional recovery of the used ultrapure water. Thus, regeneration and reuse of the chemicals are possible.

The substrate to which chemicals are attached is cleaned while clean air is made to flow in the respective spaces over the chemical bath, the ultrapure water rinse bath and the spray shower. The horizontal air curtain method is employed so that diffusion of evaporated chemicals is prevented. Further, the respective insides of the chemical bath, the ultrapure water bath and the spray shower are prevented from being contaminated by particles and the like by the horizontal air curtain. The pressure from the air curtain results in reduced exhaust gas emissions from the wet bench. Thus, the overall amount of fresh air taken from a clean room is decreased. As a result, running cost is decreased.

The used ultrapure water is fractionally recovered so that the resources can be used effectively. The used ultrapure water from the ultrapure water rinse bath is drained through dedicated piping provided in the lower part of the ultrapure water rinse bath while fresh ultrapure water is supplied to the upper part of the ultrapure water bath. Thus, regeneration and reuse of the used ultrapure water are made possible. To fractionally recover the ultrapure waste water, a collector and dedicated piping are provided.

Horizontal air blow-off opening are provided in the respective spaces over the chemical bath, the ultrapure water rinse bath and the spray shower device for flowing clean air using the horizontal air curtain method. Diffusion of chemicals evaporated from the chemical bath is thereby controlled more efficiently.

BRIEF DESCRIPTION OF THE DRAWINGS

FIG. 4 is a schematic view showing a conventional overflow type rinse bath and a drain type rinse bath according to the present invention in which ultrapure water is drained from the lower part thereof.

DESCRIPTION OF THE PRESENT INVENTION

Figure 1:
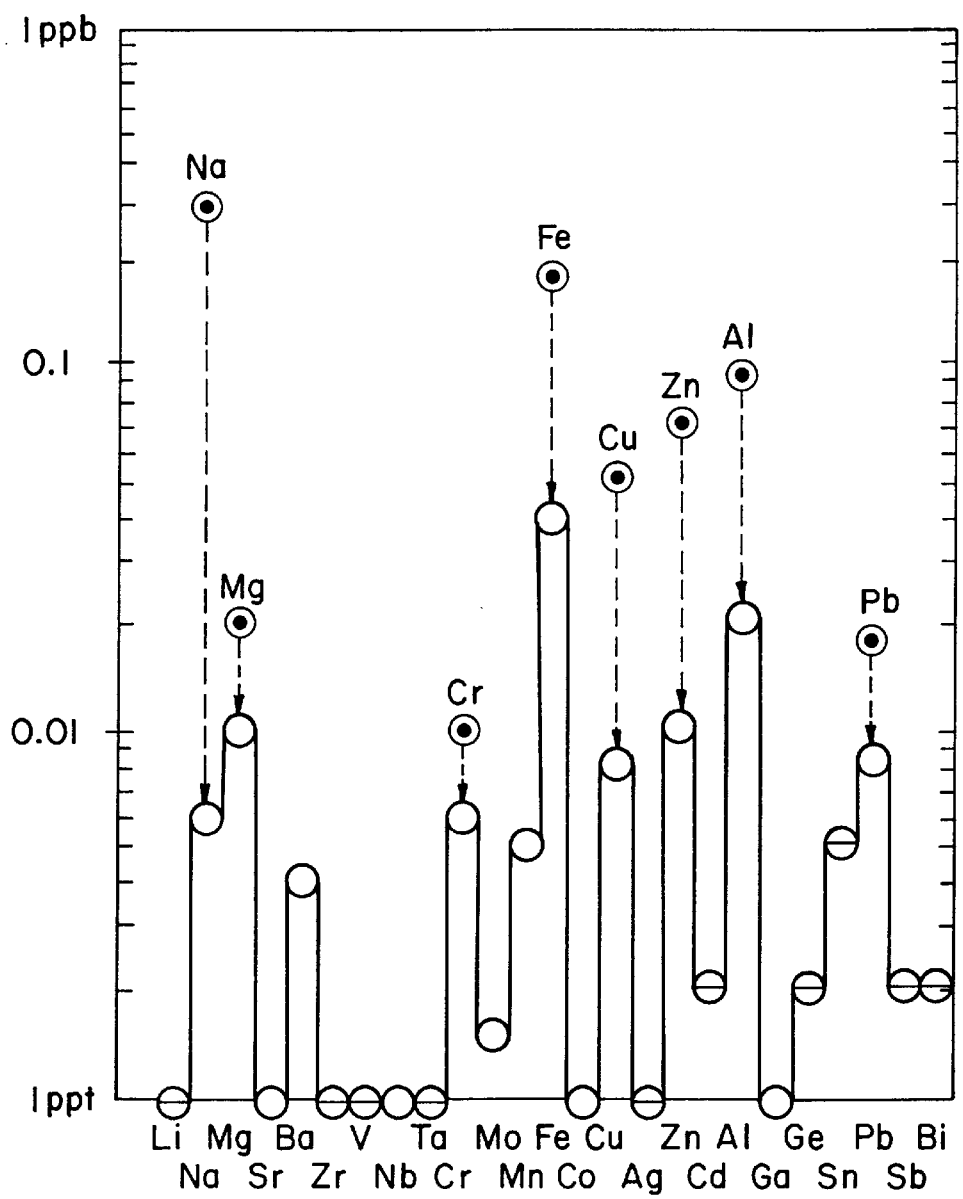
FIG. 1 is a graph collectively showing contamination levels of a glass filter caused by evaporation of hydrofluoric acid.

Referring to FIGS. 1–5, one embodiment of the present invention is described.

An apparatus is employed in which an ozonized ultrapure water line is provided inside a wet bench. A chemically-treated wafer can be rinsed by a spray shower immediately before it is placed into an ultrapure water rinse bath. It is also possible that the rinse fluid, including the sprayed chemicals, are fractionally recovered so that the recovered fluid and chemicals can be reused. Further, for decreasing the running cost of the wet bench, a filter made of polytetrafluoroethylene (PTFE) exhibiting low pressure loss and high collection rate properties is used as a ULPA filter in the bench. Further, a horizontal air curtain is installed inside the wet bench for reducing contamination during chemical treatment, spray shower and ultrapure water rinse.

Using the above-described wet station, the inventor has studied many kinds of wet processes and has found that the station of the present invention is effective for deceasing running cost of the wet process and for decreasing contamination.

Specifically, a wafer treated with a chemicals is sprayed with ultrapure water from a spray shower immediately before being placed into a rinse bath. A wafer carrier may be used to move the wafer. The wafer carrier may be in any position, such as a suspended state, or mounted on a support or the like. Ultrapure water used in a rinse, which is ozonized to 1–12 PPM of ozone can be used to remove organic substances attached to the surface of the wafer. It has been confirmed that the oxide film generated by ozonized ultrapure water is best suited as a preoxide film before a subsequent process step of thermal oxidation.

After the above-described treatment, native oxide is removed using additional treatment. This additional treatment employs the above-described rinse method, except that non-ozonized ultrapure water is sprayed onto the wafer, thereby resulting in a wafer without a native oxide film. Hydrofluoric acid and buffered hydrofluoric acid, which are the heaviest burdens in treatment of waste fluid, are fractionally recovered. The recovered fluids are then made to flow into a tower of calcium carbonate to obtain calcium fluoride without producing sludge. The recovered calcium fluoride is reused as a raw material for hydrofluoric acid. Also, phosphoric acid is recovered in a form of calcium hydrogenphosphate by a similar treatment.

Table 1 shows the time required for the conductivity of ultrapure water to return to that of original ultrapure water in a case where a wafer treated with 0.5% hydrofluoric acid was rinsed with ultrapure water. Comparison was made by varying the flow rate of ultrapure water for the two cases of use and non-use of the spray shower.

TABLE 1

| Flow rate of ultrapure water | Time required for returning to the conductivity of the original ultrapure water spray shower | |
|---|---|---|
| | used | not used |
| 10 1/min. | 30 sec. | 150 sec. |
| 20 1/min. | 20 sec. | 100 sec. |
| 30 1/min. | 12 sec. | 70 sec. |

As seen from these results, by employing a spray shower, treatment time of the ultrapure water rinse can be shortened and the amount of ultrapure water used can be reduced.

Table 2 shows pressure loss by a filter. As a comparison of filters, conventional type glass fiber filters and the filter of PTFE of the present embodiment were examined.

TABLE 2

| | Pressure Loss (mmAg) |
|---|---|
| Conventional ULPA of glass fiber | 12 |
| ULPA of low-pressure loss type glass fiber | 10 |
| ULPA of PTFE of the present embodiment | 6 |

As seen from these results, using a PTFE filter not only eliminated contamination of boron and the like caused by evaporation of hydrofluoric acid type chemicals, but also decreased pressure loss to ½. Running cost can therefore be decreased sharply in comparison with the conventional glass fiber filter.

Table 3 shows amounts of gas exhausted from the clean bench. A conventional clean bench was compared with the horizontal air curtain type clean bench. Down flow velocity was set at 0.3–0.5 m/s.

TABLE 3

| | Ordinary type bench | Horizontal-air curtain type bench |
|---|---|---|
| Velocity of down flow | 25 m³/min. | 5 m³/min. |
| Air flow velocity of air curtain | — | 1 m/s |
| Total exhaust amount | 25 m³/min. | 8.2 m³/min. |
| Ratio of exhaust amounts | 100 | 32.8 |

As seen from these results, by employing a clean-air-blowoff type clean bench, exhaust amount can be decreased to ⅓ in comparison with a conventional type bench using down flow only.

FIG. 1 shows results of investigating degree of contamination of glass fiber filters caused by evaporation of hydrofluoric acid. The conventional clean bench is compared with the horizontal-air-curtain type clean bench.

As seen from these results, by employing a clean-air-blowoff type clean bench, it is possible to decrease the contamination level of the glass fiber filter sharply.

Figure 2:
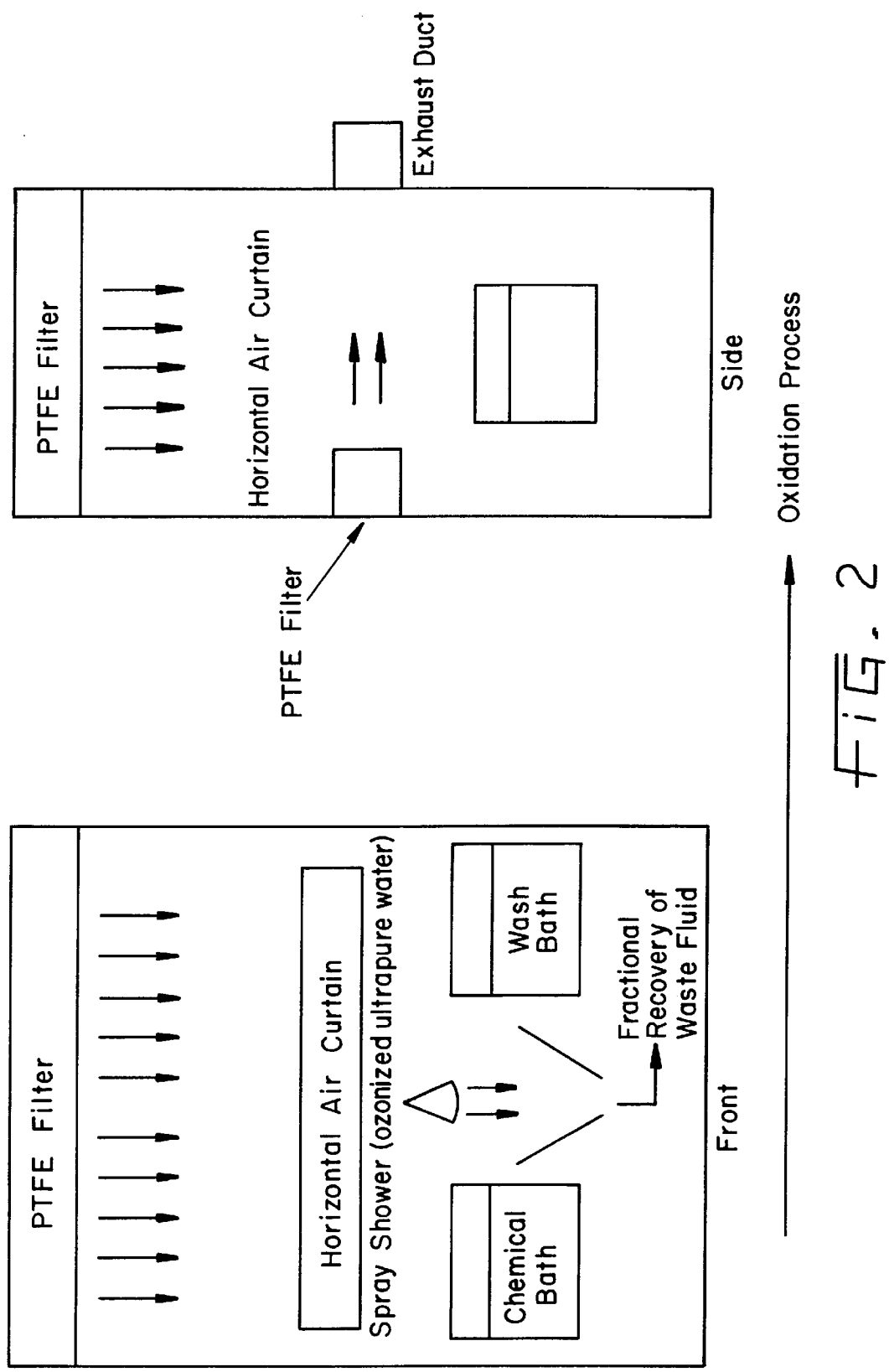
FIG. 2 is a schematic view showing a wet station according to the present invention.

A preferred embodiment of a wet cleaning apparatus using the wet station of the present invention is described referring to FIGS. 2 and 3. Fundamentally, the apparatus of the present invention comprises a chemical treatment bath, ozonized ultrapure water, a spray shower and an ozonized ultrapure water rinse bath.

FIG. 2 shows front and side views of the wet station according to the present invention. One of various kinds of substrates is cleaned in the chemical bath as shown in the front view, and pulled up from the bath. Thereafter, chemicals attached to a substrate cassette and to the substrate itself are washed by the spray shower disposed between the chemical bath and the wash bath. Next, the substrate proceeds to a wash process. In the wash bath, i.e. the rinse bath, the substrate is sufficiently cleaned with ozonized ultrapure water, during which a thin oxide film is formed on the surface of the substrate. The resulting oxide film formed by the ozonized ultrapure water improves the properties of the oxide film obtained in the following oxidation process.

The side view of FIG. 2 illustrates an airstream of the horizontal air curtain. The airstream of the horizontal air curtain flows over the area where various substrates are subjected to treatments, so that contamination of substrates and baths situated under the horizontal air curtain is remarkably reduced.

Figure 3B:
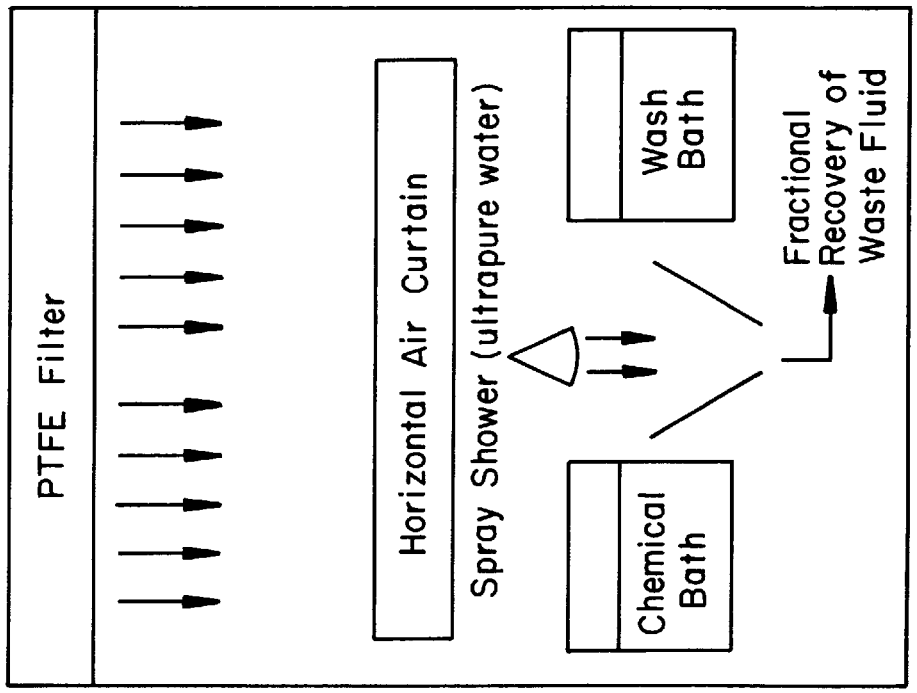
FIG. 3 is a schematic view showing a cleaning apparatus wherein an oxide film is prevented from being formed on a surface of a substrate after cleaning.
Figure 3A:
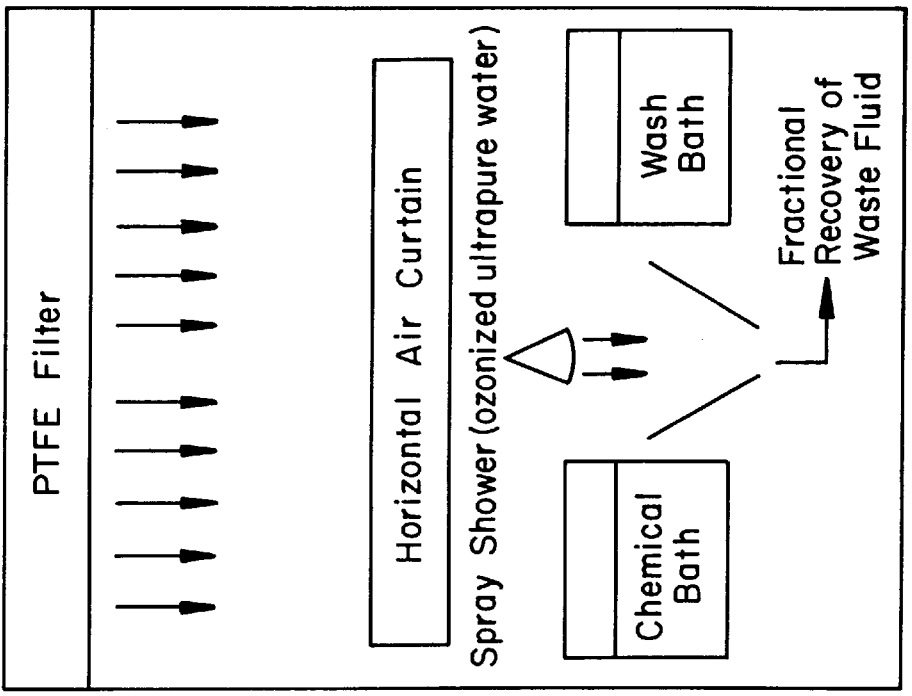

FIG. 3 shows a case where after cleaning, an oxide film is not formed on the surface of the substrate. In the cleaning apparatus shown in FIG. 3(a), the above-described cleaning procedure shown in FIG. 2 is carried out. By contrast, in the cleaning apparatus shown in FIG. 3(b), the oxide film generated on the surface of the substrate in the cleaning apparatus of FIG. 3(a) is removed, for example, by hydrofluoric acid or the like. Thereafter, the substrate is sprayed by a spray shower with non-ozonized ultrapure water. On the surface of the thus-cleaned substrate, an oxide film does not exist, and, in the case when the next process step is, for example, a metal contact forming process or the like, it has been confirmed that good contact properties are obtained.

In both wet stations shown in FIGS. 2 and 3, the chemical fluid in the chemical bath and the thick chemical solution washed out by the spray shower are all fractionally recovered, regenerated and reused. Furthermore, the amount of chemical fluid brought into the wash bath is decreased by using the spray shower. It is therefore possible to reuse the used ultrapure water from the rinse bath as raw water for new ultrapure water.

In the following, referring to FIGS. 4 and 5, results of comparisons between the overflow method and the drain method are described.

Figure 5:
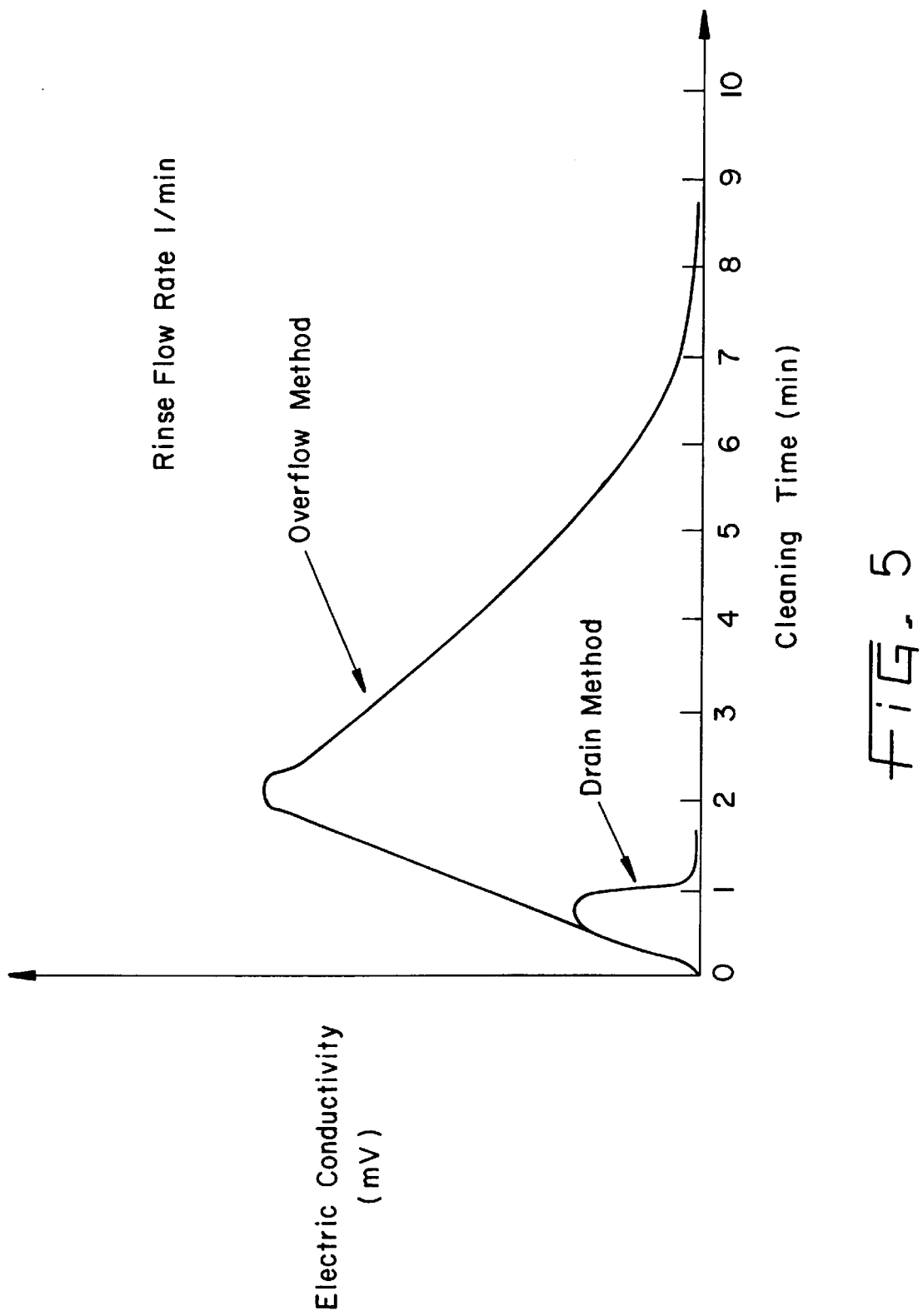
FIG. 5 is a graph showing displacement rates of ultrapure water in rinse baths, evaluated by measurements of electric conductivity inside the rinse baths.

In the conventional type overflow method (FIG. 4(a)) as well as the drain method (FIG. 4(b)) of the present invention, in which used ultrapure water is drained from the lower part of the rinse bath, a displacement rate of ultrapure water in the rinse bath was evaluated by measuring an electric conductivity inside the rinse bath (FIG. 5).

Sodium chloride was mixed as a contamination source, and ultrapure water was supplied in accordance with the above-described two methods respectively. As a result, it was found that, when the drain method was used, electric conductivity returned to its original value much faster and the displacement rate was better. In FIG. 5, the difference in the time required to return to the original electric conductivity is shown.

Thus, regarding the ultrapure water rinse bath, by draining used ultrapure water from the lower part of the rinse bath and supplying fresh ultrapure water through the upper part of the rinse bath, displacement efficiency of ultrapure water inside the rinse bath is increased in comparison with the conventional overflow method, in which ultrapure water is supplied through the lower part of the rinse bath.

According to the present invention, because of (i) supply of ozonized ultrapure water, (ii) separation of high concentration chemicals from ultrapure water rinse fluid, (iii) reuse of waste fluid produced by the spray shower cleaning (regenerated chemicals), and reuse of waste fluid of an ultrapure water cleaning bath (return to an ultrapure water system, (iv) use of ULPA filter made of PTFE (elimination of a glass fiber filer), (v) introduction of a horizontal air curtain, and (vi) introduction of the drain type ultra pure water rinse bath, there is obtained:

(1) a wet station in which throughput of ultrapure water rinse is high, and organic substances attached to a substrate can be removed by the ultrapure water rinse:

(2) a wet cleaning method using a wet station in which regeneration and reuse of chemicals are possible; and (3) a wet cleaning apparatus using a wet station in which regeneration and reuse of ultrapure water are possible.

As a result of the treatment by ozonized ultrapure water, a wafer surface treated by the present invention is one without organic substance contamination. As a result of the treatment inside the horizontal-air-curtain type clean bench a wafer is obtained without impurity contamination. The oxide film generated is best suitable as a peroxide film, i.e. in preparation for a thermal oxidation process.

In the case of forming metal contacts on the substrate, optimum contacts are obtained by using a non-ozonized ultrapure water spray shower.

Furthermore, chemicals in the treating water are fractionally recovered, and can be regenerated and reused. Running costs can be reduced by using a filter of low pressure loss and high collection efficiency.

I claim:

1. A wet station for cleaning substrates during semiconductor fabrication, comprising:

a ceiling;

a wet bench;

a chemical bath;

an ultrapure water rinse bath;

an upper space between the chemical bath and the ultrapure water rinse bath;

a low pressure loss, high collection rate polytetraflouroethylene filter provided in said ceiling; and a spray shower disposed in said upper space for spraying one of ultrapure water and ozonized ultrapure water on substrates located in said wet station, said spray shower having a finely-porous nozzle.

2. A wet station as in claim 1, further comprising dedicated piping disposed in a lower part of said ultrapure water rinse bath for draining used ultrapure water.

3. A wet station as in claim 2, wherein:

horizontal air blowoff openings are disposed over said chemical bath, said ultrapure water rinse bath and said spray shower.

4. A wet station as in claim 2, wherein:

used ultrapure water is drained through said dedicated piping while ultrapure water is supplied to an upper part of said ultrapure water rinse bath.

5. A wet station as in claim 4, wherein:

horizontal air blowoff openings are disposed over said chemical bath, said ultrapure water rinse bath and said spray shower device.

* * * * *